United States Patent [19]

Ishikawa et al.

[11] Patent Number: 5,248,853
[45] Date of Patent: Sep. 28, 1993

[54] SEMICONDUCTOR ELEMENT-MOUNTING PRINTED BOARD

[75] Inventors: Junji Ishikawa, Nagoya; Nobumasa Ishida, Chiryu; Kaoru Nomoto, Okazaki, all of Japan

[73] Assignee: Nippondenso Co., Ltd., Kariya, Japan

[21] Appl. No.: 791,679

[22] Filed: Nov. 14, 1991

[51] Int. Cl.⁵ .............................................. H05K 1/00
[52] U.S. Cl. ..................................... 174/256; 361/388; 361/400; 361/414; 361/708; 361/783; 361/792
[58] Field of Search ............... 174/250, 252, 256, 262; 357/80; 361/386, 387, 388, 397, 400, 409, 411, 414, 417

[56] References Cited

U.S. PATENT DOCUMENTS

| | | | |
|---|---|---|---|
| 4,755,417 | 7/1988 | Detoma | 174/256 |
| 4,812,792 | 3/1989 | Lebowitz | 361/414 |
| 4,926,242 | 5/1990 | Itoh et al. | 357/80 |

Primary Examiner—Leo P. Picard
Assistant Examiner—Cheryl R. Figlin
Attorney, Agent, or Firm—Cushman, Darby & Cushman

[57] ABSTRACT

A semiconductor element-mounting printed board, comprising a substrate having a thermal expansion coefficient not higher than $4.5 \times 10^{-6}/°$ C., a buffer layer formed on at least one of the surfaces of the substrate and having a Young's modulus not higher than 450 kg/mm², a conductor circuit formed on a surface of the buffer layer, the conductor circuit having predetermined patterns, and a semiconductor element bonded to the conductor circuit by soldering.

8 Claims, 8 Drawing Sheets

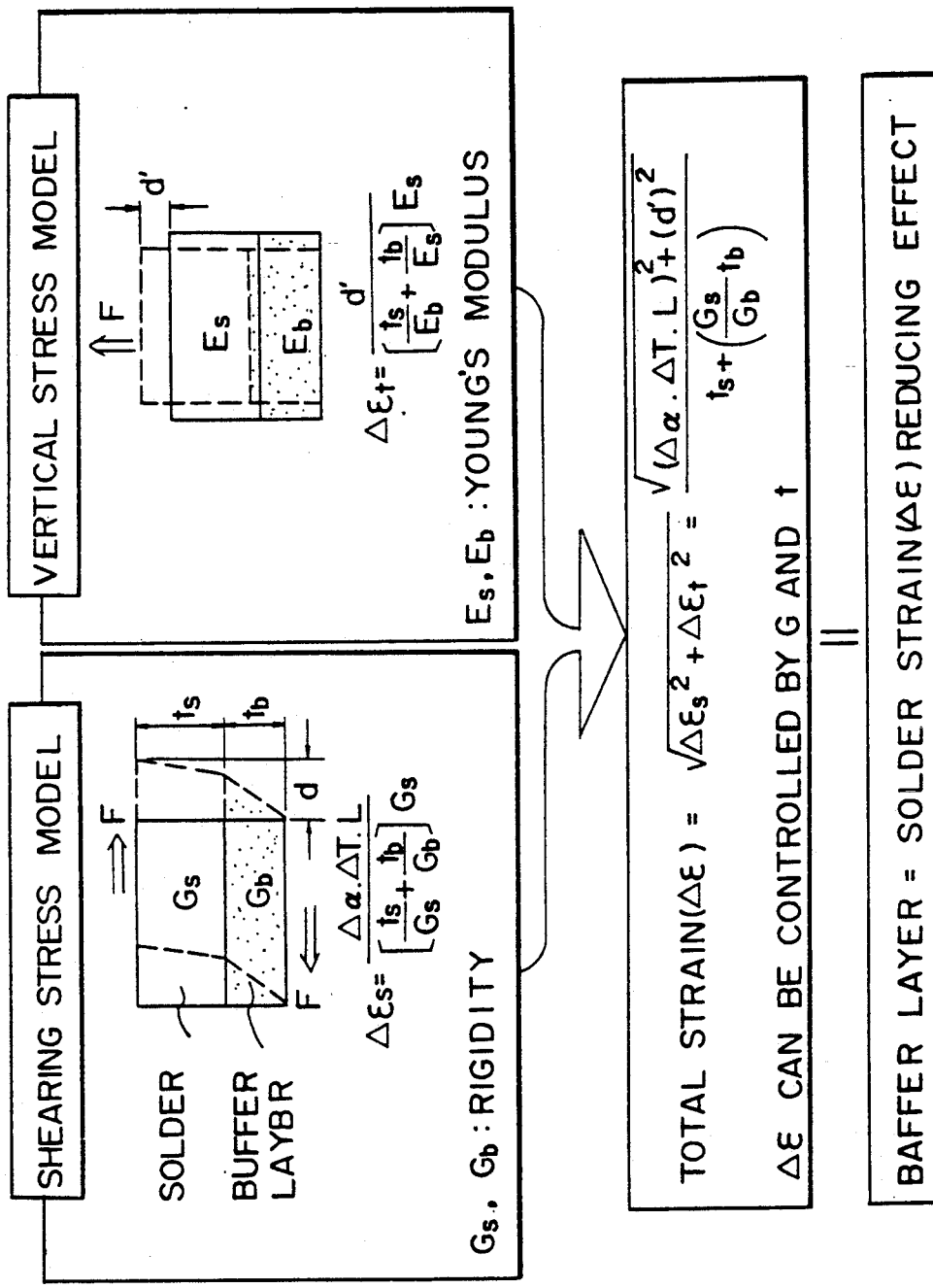

THICKNESS OF BUFFER LAYER $t_b$ (mm)

INVENTION

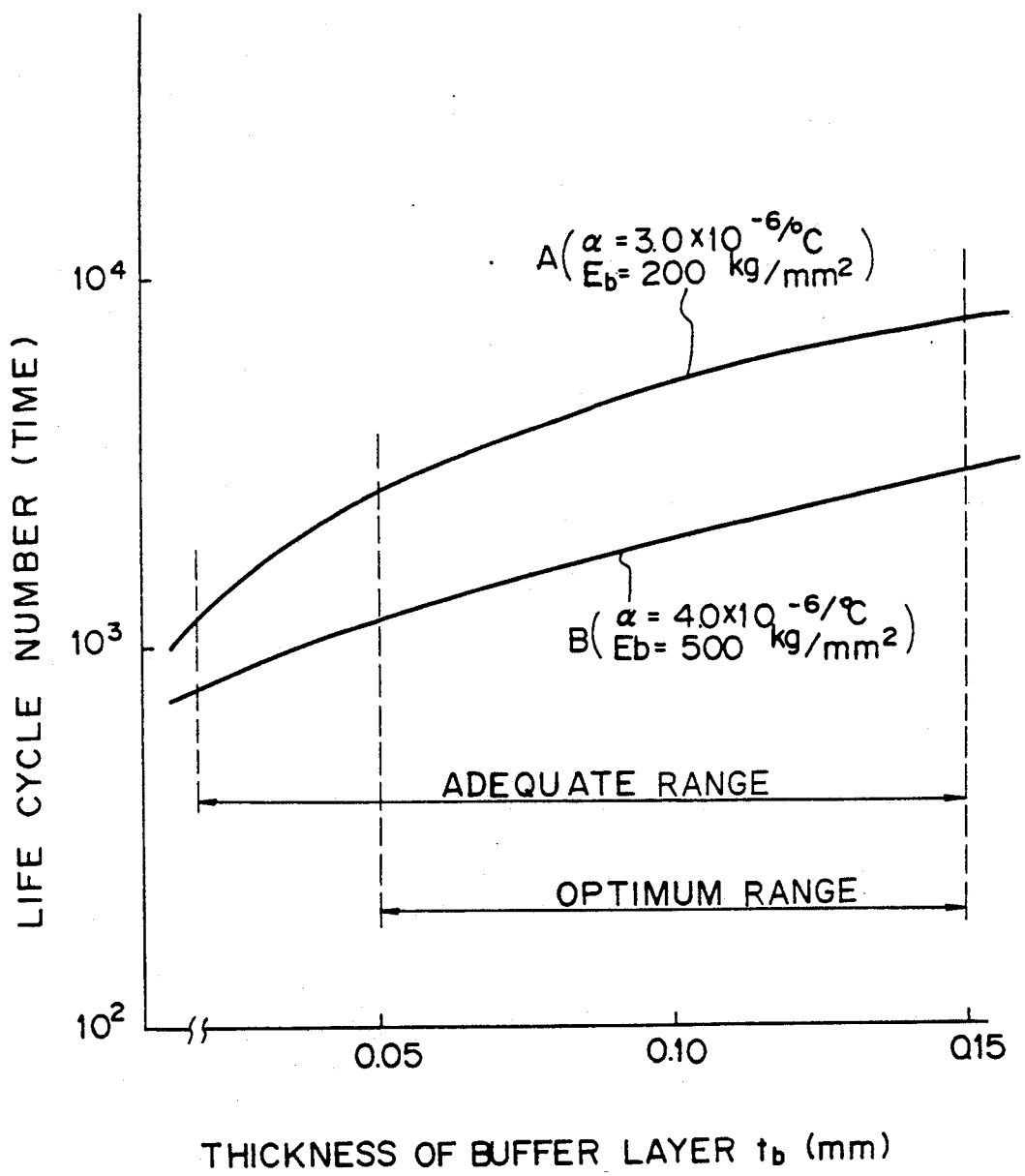

SEMICONDUCTOR ELEMENT-MOUNTING PRINTED BOARD

BACKGROUND OF THE INVENTION

1. Field of the Invention

The present invention relates to a surface mounting-type semiconductor element-mounting printed board.

2. Description of the Related Art

The mounting of a printed board can be grouped into an insertion mounting type and a surface mounting type, but the latter is now more widely used than the former. Further, in the surface mounting type, a bare chip direct mounting is now more widely used than a package element mounting.

In the bare chip mounting process, the number of electrodes per unit area is increased, and thus the bonding portion is finer. Accordingly, the bonding portion in the bare chip mounting is subject to a concentrated thermal stress, to thereby increase the strain at soldered portions and cause fatigue breakages, and as a result, the number of times the life time test, described later, is repeated is, for example, less than 700, and thus the reliability of the bonding portion is undesirably lowered.

To solve the above problem, Japanese Unexamined Patent Publication (Kokai) No. 61-208889 proposes an insulating resin layer 8 for releasing heat in a metal substrate 9, a conductor circuit 7 being formed on the insulating resin layer 8 as seen in FIG. 1. Japanese Unexamined Patent Publication (Kokai) No. 61-295692 discloses, as the above metal substrate, a metal substrate composed of an invar plate and a copper foil and having a high thermal conductivity and low thermal expansion coefficient.

Further, it is known that the following means are effective for solving the above problem; the thermal expansion coefficients of a chip element and a substrate are made as identical as possible, and thus the shear stress due to a difference between the thermal expansion coefficients is made as small as possible. To accomplish this, the thermal expansion coefficient of the substrate 9 must be made as small as possible and approximately the same as that of chip elements or a conductor circuit 7. Moreover, a resin insulating layer 8 having an excellent thermal release is formed between the substrate 9 and the conductor circuit 7, to prevent a storage of heat in the substrate 9 and the conductor circuit 7.

Nevertheless, even if an insulating layer 8 and a conductor circuit 7 are formed on a side of the substrate 9, the substrate 9 is easily warped. Moreover, in such a composite substrate, a warping of the substrate may occur due to a change of atmosphere, if the thickness of the insulating layer 8 is not adequate, and a perpendicular stress is then increased at the bonding portion, and thus the reliability of the bonding portion is poor.

SUMMARY OF THE INVENTION

The object of the invention is to provide a semiconductor element-mounting printed board in which the stress at the connecting portion is reduced so that the soldered bonding between chip elements and a substrate has a high reliability.

The above object of the present invention is attained by a semiconductor element-mounting printed board, comprising a substrate having a thermal expansion coefficient not higher than $4.5 \times 10^{-6}/°C$., a buffer layer formed on at least one of the surfaces of the substrate and having a Young's modulus not higher than 450 kg/mm², a conductor circuit arranged on a surface of the buffer layer, the conductor circuit having predetermined patterns, and a semiconductor element bonded to the conductor circuit by soldering. The buffer layer is preferably made of a material satisfying the following formula:

$$t_b/E_b > \frac{[(190 \cdot \Delta\alpha \cdot 1)^2 + d^2]^{\frac{1}{2}}}{0.016 \, E_s} - (t_s/E_s) \quad (1)$$

where
 $t_b$ denotes a thickness of the buffer layer,
 $E_b$ denotes a Young's modulus of the buffer layer, $\Delta\alpha$ denotes a difference of the thermal expansion coefficient of the chip element and of the substrate,
 d denotes a constant determined by bending behavior, etc. of the substrate ($3.0 \times 10^{-3}$ mm),
 $t_s$ denotes height of the soldering,
 $E_s$ denotes a Young's modulus of the soldering, and
 1 denotes a size of the chip element or half of a distance between outermost bumps.

Here, $t_b$ is not more than 0.15 mm, considering the thermal release and formability, etc., and $E_b$ is not less than 200 kg/mm², considering the copper foil adhesive force.

The above formula is derived as shown below:

FIG. 2 shows an analysis of the thermal stress buffering mechanism, which includes a model of a shear stress due to a difference in the thermal expansion coefficients of the solder and the buffer layer, and a model of a vertical stress due to warping, at an electrode portion.

From the fundamental laws of the kinetics, $F = \sigma t$ and $\sigma = \epsilon G$; where F stands for a force, $\sigma$ stands for a stress, t stands for a height, $\epsilon$ stands for a strain, and G stands for a rigidity. Therefore, $$\epsilon_s = \frac{\sigma_s}{G_s} = \frac{F}{t_s G_s},$$

$$\epsilon_b = \frac{\sigma_b}{G_b} = \frac{F}{t_b G_b},$$

where $\epsilon_s$ stands for a strain of the solder, $\epsilon_b$ stands for a strain of the buffer, $G_s$ stands for a rigidity of the solder, and $G_b$ stands for a rigidity of the buffer layer. By eliminating F, $$\epsilon_b = \frac{\epsilon_s t_s G_s}{t_b G_b} \quad (2)$$

Thus, since the deformation is a combination of a deformation $d_s$ of the solder and a deformation $d_b$ of the buffer layer, $$d = d_s + d_b$$

and this equals $\Delta\alpha \Delta TL$; where $\alpha$ stands for a thermal expansion coefficient, T stands for a temperature, and L stands for a length of a chip.

Further, from $\epsilon_s = \frac{d_s}{t_s}$ and $\epsilon_b = \frac{d_b}{t_b}$, $$d = d_s + d_b = \epsilon_s t_s + \epsilon_b t_b = \Delta\alpha \Delta TL.$$

By substituting the formula (2) for this formula, $$\epsilon_S = \frac{\Delta\alpha\Delta TL}{[t_s/G_s + t_b/G_b]\,G_s} \quad (3)$$

Similarly, the following formula is derived for the vertical stress.

$$\Delta\epsilon_t = \frac{d'}{[t_s/E_s + t_b/E_b]\,E_s} \quad (4)$$

where $\epsilon_t$ stands for a strain of the solder, $d'$ stands for a warping, $E_s$ stands for a Young's modulus of the solder, and $E_b$ stands for a Young's modulus of the buffer layer.

From the formulae (3) and (4), the following formula is obtained.

$$\begin{aligned}\Delta\epsilon &= [\Delta\epsilon_s^2 + \Delta\epsilon_t^2]^{\frac{1}{2}} \\ &= \frac{[(\Delta\alpha\Delta TL)^2 + (d')^2]^{\frac{1}{2}}}{t_s + (G_s/G_b)t_b}\end{aligned} \quad (5)$$

It is seen from the formula (5) that the total solder strain $\Delta\epsilon$ can be controlled by selecting the rigidity $G_b$ and the thickness $t_b$ of the buffer layer.

It is found that the life requirement is satisfied if the solder strain $\epsilon_s$ in the formula (5) is less than a certain constant, this certain constant being 0.016 (solder strain tolerance). Therefore, by substituting less than 0.016 for $\epsilon_s$ in the formula (5), and modifying the formula, $$t_b/E_b > \frac{[(190\Delta\alpha\cdot 1)^2 + d^2]^{\frac{1}{2}}}{0.016\,E_s} - (t_s/E_s) \quad (1)$$

where 190° C. is used for $\Delta T$ from the condition used in the evaluation in the present invention, and the modulus of elasticity E is substituted for the rigidity G, because: there is a certain relationship therebetween.

The low thermal expansion coefficient substrate may be formed of the following composite materials. Namely, composite material of synthetic resins such as epoxy, polyimide, polyester, phenolic, fluorine and polybutadiene resins, with low thermal expansion coefficient fibers such as aramide fibers (Kevlar fiber, Ecol Fiber), quartz fiber, carbon fiber, ceramic fiber, ceramic fibers (single or composite of SiC, SiO$_2$, Si$_3$N$_4$, Al$_2$O$_3$, AlN, TiC, TiO$_2$, TiN, ZrO$_2$, boron, or sialone). The substrate may be of INVAR (trademark for the ferronickel: Ni 36, steel 64% (carbon content 0.2%), d.8.0, m.1500, and having a low coefficient of heat expansion), copper laminated invar, iron-alloy, alloys such as 42 alloy, molybdenum, polysilicon, or cobalt.

The buffer layer is preferably formed on both surfaces of the substrate, in a well-balanced condition, The buffer layer is formed to absorb and remove thermal stresses appearing at the soldered bonding portion by a mechanism such as that of a shock absorber, as described later. The thermal stresses include a shear stress caused by the difference in the thermal expansion coefficients of the flip chip element and the substrate and a perpendicular stress caused by a bending of the substrate.

The buffer layer may be formed of heat resistant polymeric materials such as thermoplastic resins including polyolefin-based, epoxy-based, polymide-based, phenol-based, polyester-based, polybutadiene-based, fluorine-base, polysurphone, polyetherimide, polysurphoneimide, polyphenylenesurphide, polyallylsurphone, polybutyleneterepthalate, polyethyleneterephthalate, polypropyrene, polymethylmethacrylate, polycarbonate, polyacrylate, polycarbonate, polyallylate, polyamideimide, or polyetheretherketone.

Preferably, the conductor circuit is formed of copper, gold, nickel, or silver, and has a thickness of 18 to 35 μm. The conductor circuit is formed by printing, etching, or plating (electroless plating, electric plating). The flip chip element is a typical surface mounting element.

The substrate preferably has a thermal expansion coefficient of 0 to 30.0×10$^{-6}$/° C., particularly 2.0×10$^{-6}$/° C. to 4.0×10$^{-6}$/° C.

The buffer layer preferably has a Young's modulus of 1600 kg mm$^2$ or less, particularly 200 to 500 kg mm$^2$. This Young's modulus always satisfies the formula (1) in a range of −65° C. to 125° C.

The buffer layer preferably has a thickness of 0.02 to 0.15 mm, particularly 0.05 to 0.15 mm.

The materials concerning the thickness and the Young's modulus of the buffer layer, the difference of thermal expansion coefficient between the substrate and the chip element, and the bending of the substrate, are determined by the above formula (1).

In a printed board of the present invention, the substrate is formed of a material having a low thermal expansion coefficient. Accordingly, the thermal expansion coefficient of the substrate is close to those of the conductor circuit and chip element, thus preventing a shear stress due to a difference between the substrate and chip element.

Further, in the printed board of the present invention, since a buffer layer having a certain thickness is inserted between the substrate and the conductor circuit, a perpendicular stress caused mainly by a bending of the substrate can be absorbed and removed by a mechanism similar to that of a shock absorbor. More specifically, the buffer layer having a Young's modulus of, for example, less than 500 kg/mm$^2$, is elastically deformed by the above stress, whereby even if a bending of the substrate occurs, the buffer layer acts as a spring between the substrate and conductor circuit by the mechanism similar to that of a shock absorbor. As a result, a perpendicular stress caused by a bending of the substrate is absorbed by the buffer layer, and the thermal stress appearing at the bonding portions is alleviated (see FIG. 3). Due to a low Young's modulus, the buffer layer produces only a small stress upon elastic deformation, and the stress causing the deformation of the solder is also small. Note, a formation of the buffer layer on both surfaces of the substrate should be well-balanced, to make any bending of the substrate as small as possible.

Thus, according to the present invention, there is provided a surface mounting-type semiconductor element-mounting printed board in which a strain at the bonding portion is reduced and the reliability of the soldered portion between a chip element and the substrate is high.

BRIEF DESCRIPTION OF THE DRAWINGS

FIG. 2 shows an analysis of a thermal stress buffering mechanism;

FIG. 11 shows the relationships between the life cycle number and the thickness of the buffer layer.

DESCRIPTION OF THE PREFERRED EMBODIMENTS

In all Examples, $\Delta\alpha$ can be obtained by calculating a difference of a thermal expansion coefficient of a chip element from that of a substrate in which the thermal expansion coefficient of the chip element is $3.0 \times 10^{-3}/°$ C. The constant d, a warping of a substrate, is $3.0 \times 10^{-3}$ mm for a substrate of a copper-laminated invar and $5.0 \times 10^{-3}$ mm for a substrate of an aramide. The height $t_s$ of the solder is $80 \times 10^{-3}$ mm, the Young's modulus of the solder is 1100 kg/mm$^2$, and a half of a longest distance between the outermost bumps, i.e., 1, is 2,881 mm.

Thus, by selecting the Young's modulus $E_b$ and thickness $t_b$ of the buffer layer to satisfy the formula (1), with the other data above, the present invention is attained as follows.

An example of a printed board of the present invention is described with reference to FIG. 2-6.

Figure 1:
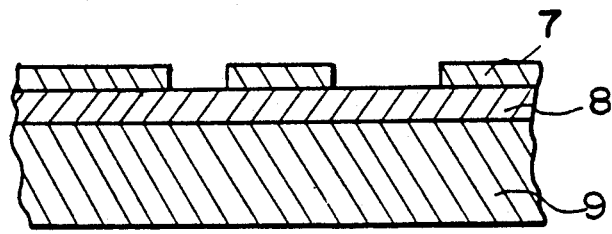
FIG. 1 is a sectional view of a prior art substrate used for a bare chip mounting.
Figure 3:
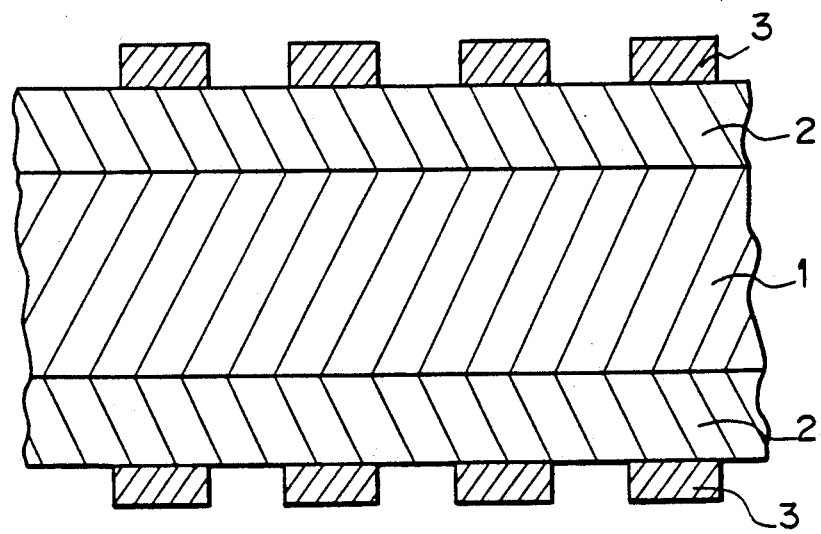
FIG. 3 is a sectional view of a printed wiring board.

The printed board comprises a substrate 1 having a low thermal expansion coefficient, buffer layers 2 formed on top and rear surfaces of the substrate 2, and a conductor circuit 3 formed on the buffer layers 2. Flip chip elements 5 having a soldering electrode are mounted on the conductor circuit 3 with a soldered bonding portion 6, as seen in FIG. 3.

Figure 4:
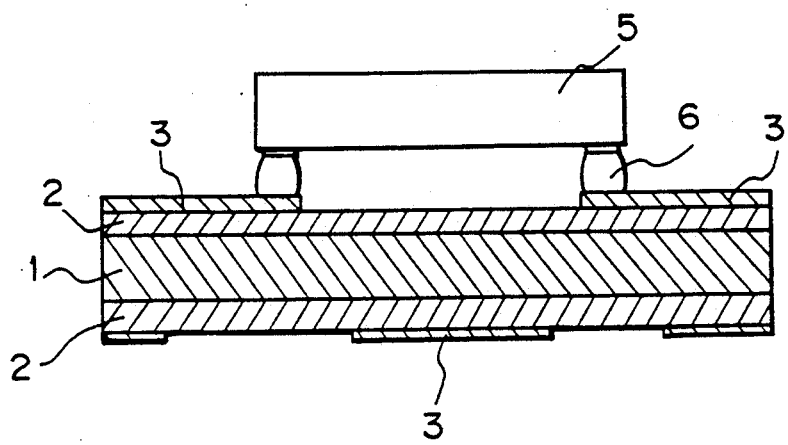
FIG. 4 is a sectional view of a portion of a printed wiring board mounting a flip chip element.
Figure 5:
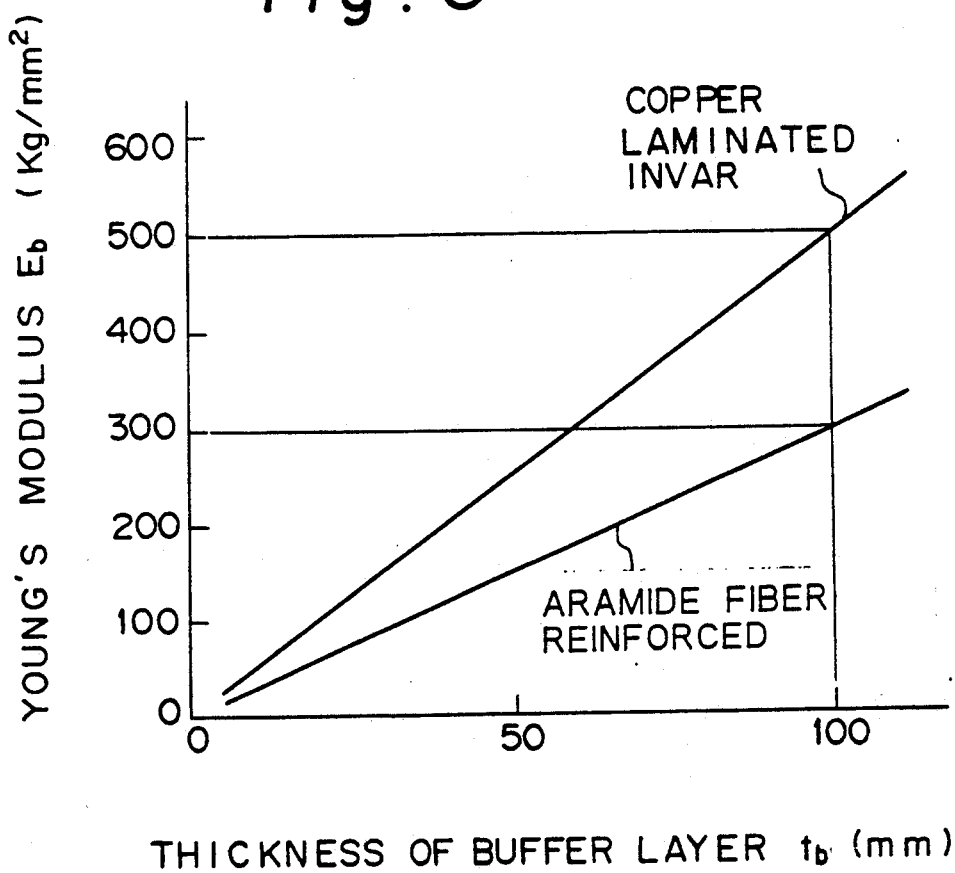
FIG. 5 shows the relationships between the thickness of the buffer layer and the Young's modulus.

The substrate 1 is of a copper laminated invar or a composite substrate reinforced by Kevlar fibers. The copper laminated INVAR is a cladding material of an invar plate laminated with a copper foil on top and rear surfaces thereof. The thermal expansion coefficient of the invar plate is $0.2 \times 10$ to $0.5 \times 10^{-6}/°$ C. and that of the copper is about $17.0 \times 10^{-6}/°$ C. Therefore, the thermal expansion coefficient of the copper-laminated invar plate may be optionally controlled between $0.2 \times 10^{-6}/°$ C. and $17.0 \times 10^{-6}/°$ C. For the thermal expansion coefficient of a substrate having a copper-laminated invar plate as a core material, i.e., $5.0 \times 10^{-6}/°$ C., as seen in FIG. 4, when the thickness $t_b$ of the buffer layer 2 is, for example, about 100 µm, a Young's modulus of the buffer layer in a range of not more than about 500 kg/mm$^2$ is considered adequate.

The Kevlar fiber is another name for an aramide fiber and is also called an aromatic polyamide fiber. This fiber has a high specific strength, a low expansion (low thermal expansion coefficient), a resistance to corrosion, and is flexible.

The buffer layer 2 is formed of a resin such as polyolefin, modified epoxy, modified phenolic, and fluorine resins, etc. The buffer layers 2 have a thickness of 100 µm and are formed by heat-press molding. The material of the buffer layer 2 has a Young's modulus of not more than 500 kg/mm$^2$.

The conductor circuit 3 is a copper foil and has a thickness of 18 to 35 µm. A copper laminated on the buffer layers 2 on top and rear surfaces of the substrate 1 is processed by forming a photoresist and etching, to thus form a conductor circuit.

The flip chip elements have a size of about 5 mm square and a soldered bump electrode is formed on each flip chip element.

This example of the printed board functions as shown below.

Since the substrate 1 is of copper laminated invar having a low thermal expansion coefficient, the thermal expansion coefficient of the substrate 1 is close to those of the conductor circuit 3 and the flip chip element 5.

Since a buffer layer 2 having a thickness of, for example, about 100 µm, is inserted between the substrate 1 and the conductor circuit 3, the perpendicular stress caused by a bending of the substrate 1 can be absorbed and removed by a mechanism like that of a shock absorbor, as shown in FIG. 2.

Figure 6A:
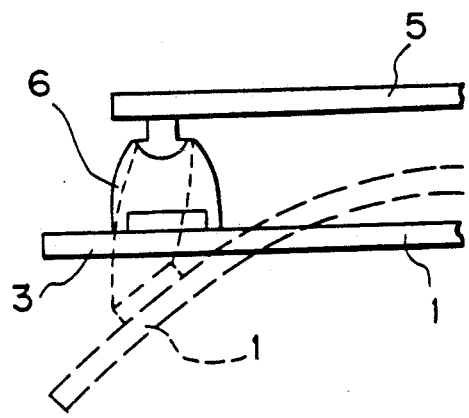
FIGS. 6A and 6B show an absorption of a vertical stress in a printed wiring board.
Figure 6B:
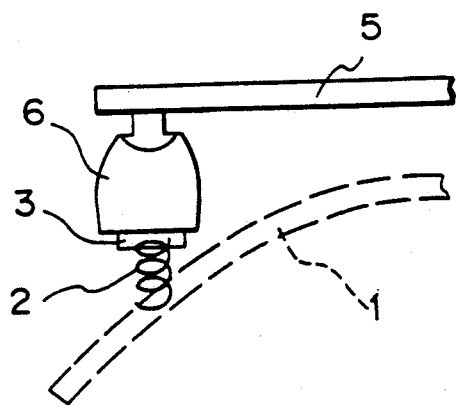
Figure 7:
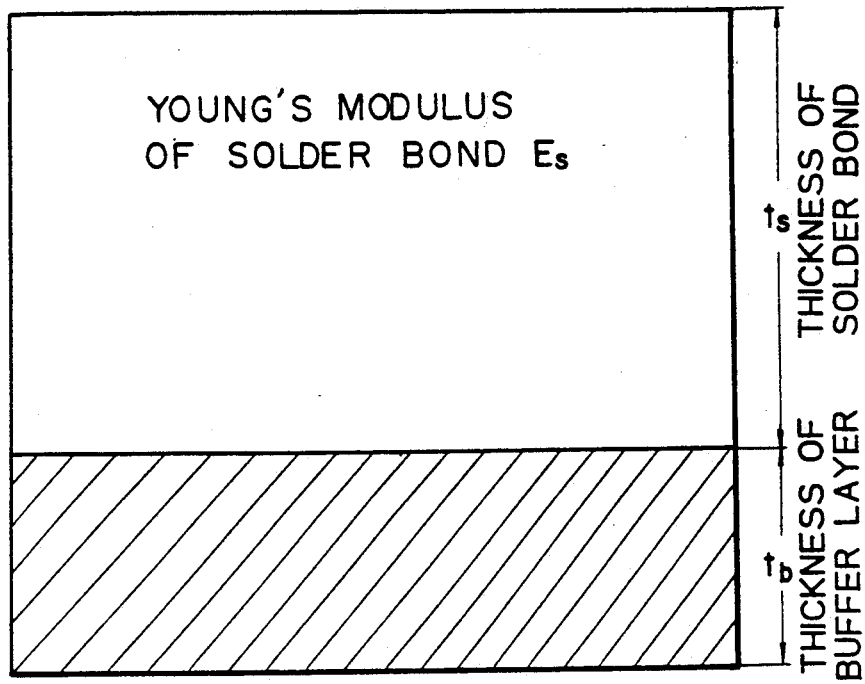
FIG. 7 shows the relationships between the Young's modulus of the buffer layer and the thickness of the solder bond.

FIG. 6A shows the prior art and FIG. 6B shows the present invention. In FIG. 6A, when a substrate 1 without a buffer layer 2 is bent, the chip element 5 together with the soldered portion 6 are drawn by the bent substrate 1 and a large stress is produced at the soldered portion 6. In contrast, in FIG. 6B, a buffer layer 2 is formed and this buffer layer 2 acts as a spring, and therefore, if the Young's modulus of the buffer layer 2 is, for example, less than 500 kg/mm$^2$, the buffer layer 2 absorbs, by an elastic deformation, a strain imposed toward the soldered portion 6 by the above stress (see FIG. 7). As a result, even if the substrate 1 is bent, a perpendicular stress formed by the bending is absorbed by the buffer layer 2, and thus the thermal stress appearing at the soldered portion 6 or the like is mitigated.

Moreover, since the buffer layers 2 are formed uniformly on both surfaces of the substrate 1, and are well balanced, it is difficult to bend the substrate 1.

Accordingly, in this example, there is obtained a reliable surface mounting-type semiconductor element-mounting printed board having a desired long life time, for example, a number of 1200 in the later-described life time test.

Figure 8:
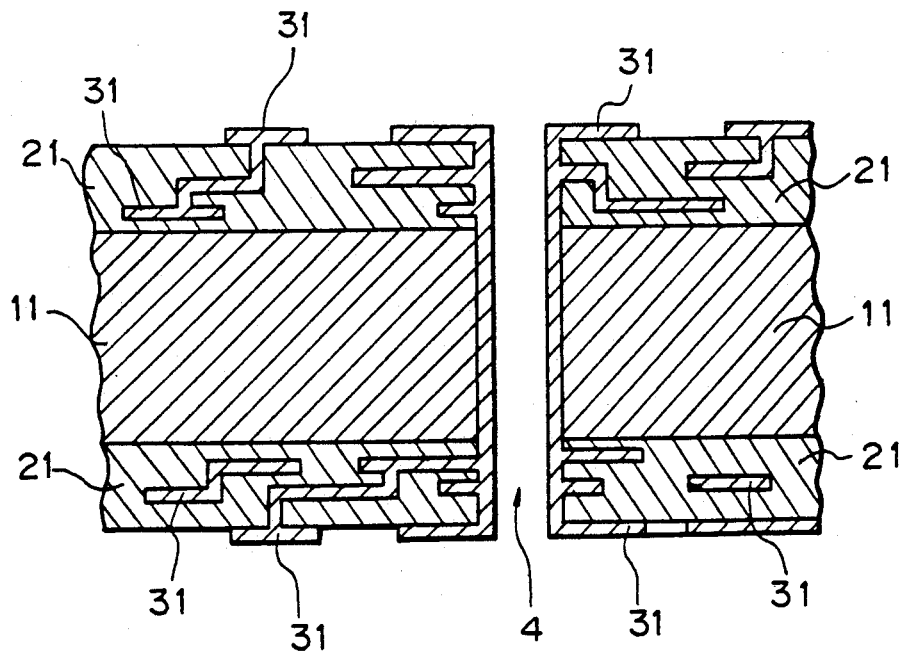
FIG. 8 is a sectional view of a printed wiring board of Example 2.

Another example of the printed board of the present invention is described with reference to FIG. 8.

This example of the printed board is similar to the above example but has a multi-layer structure on both sides of the board. Namely, this example of the printed board comprises a conductor circuit 31 of a plurality of conductor layers formed on and in a buffer layer 21 and through holes 4 connecting the conductor circuits 31 on the top and rear surfaces thereof.

In this example, since buffer layers 21 are provided between the substrate 1 and the conductor circuit 31, as in the above example, even if flip chip elements are bonded on this printed board by soldering, a stress appearing at the soldered portion is small due to the action of the buffer layer 21, thus obtaining a high reliability.

Therefore, the same effects as in the above example are obtained in this example.

Next, the property test of a printed board is described with reference to FIGS. 3 to 6.

The printed boards as shown in FIG. 4 are made by using various materials for the substrate 1 and the buffer layer 2, and the thermal expansion coefficient of the substrate 1, the Young's modulus and thickness of the buffer layers 2, and the life repeating number of the printed board after soldering the flip chips are measured.

The file test is a gaseous cold and hot cycle test for samples having flip chip elements 5 soldered on the surface of the conductor circuit 3. In this test, the sample is held at $-65°$ C. for 30 minutes and then at 125° C. for 30 minutes, and this cycle is repeated. The test is ended when the soldered portion 6 becomes electrically disconnected or broken, for example, by an expansion and shrinkage of the substrate 1, thermal stress at the soldered portion 6, and the like, and the number of cycles at the end of the test is the life number. In Table 1, the average life is obtained by a Weibull analysis and represents the life when 50% of the whole samples are broken.

The Young's modulus is determined by preparing samples in which the shape of the central portion of the buffer layer 2 (a space between standard lines) is controlled, and using an autograph-micrometer (sample shape measuring machine) and a strain meter (a measuring machine by a strain gauge), provided with a thermostat. A 24 hours conditioning is carried out as the pretreatment, and then peeling is carried out at a peeling rate of 5 mm/min at $-65°$ C., at room temperature, at 80° C., and at 125° C. Four samples are used for each temperature, to a total of 16 samples.

In this test, the Poison ratio, the yielding point and the break strength are simultaneously measured. Among the above, the Young's modulus of the buffer layer and the life number (average life) of the printed board with flip chip elements are shown in Tables 1 to 3. Tables 2 and 3 show results of samples of the present invention and Table 3 shows results of comparative samples. In the Tables, the optimum range is that providing a life cycle number of 1200 times or more, even if any one of the thermal expansion of the substrate and the Young's modulus and the thickness of the buffer layer is outside of the designated range. In the estimate, o denotes good, Δ denotes satisfactory, and x denotes poor.

TABLE 1

| property No. | Substrate Material | Thermal expansion coefficient (°C.$^{-1}$) | Buffer layer Material | Young's modulus (kg/mm$^2$) | Thickness (μm) | Matching optimum range | Average life (cycle) | Evaluation |
|---|---|---|---|---|---|---|---|---|
| 1 | Copper laminated invar | 3.8 × 10$^{-6}$ | Phenolic resin | 400 | 100 | o | 3000 | o |
| 2 | Copper laminated invar | 3.4 × 10$^{-6}$ | Epoxy resin | 450 | 100 | o | 3000 | o |
| 3 | Copper laminated invar | 2.2 × 10$^{-6}$ | Polyimide resin | 450 | 100 | o | 2600 | o |
| 4 | Copper laminated invar | 4.0 × 10$^{-6}$ | Polyester resin | 350 | 100 | o | 2000 | o |
| 5 | Copper laminated invar | 3.9 × 10$^{-6}$ | Fluorine containing resin | 400 | 100 | o | 3000 | o |
| 6 | Copper laminated invar | 3.6 × 10$^{-6}$ | Polysulphone resin | 400 | 100 | o | 2700 | o |
| 7 | Copper laminated invar | 3.2 × 10$^{-6}$ | Polyether sulphone | 450 | 100 | o | 4500 | o |
| 8 | Copper laminated invar | 3.1 × 10$^{-6}$ | Polyetherimide | 450 | 100 | o | 4000 | o |
| 9 | Copper laminated invar | 3.8 × 10$^{-6}$ | Polyether-etherketone | 460 | 100 | o | 6000 | o |
| 10 | Copper laminated invar | 3.8 × 10$^{-6}$ | Polyamideimide | 400 | 100 | o | 3600 | o |
| 11 | Aramide paper epoxy | 3.1 × 10$^{-6}$ | Phenolic resin | 450 | 100 | o | 2000 | o |
| Target value | | 2~4 × 10$^{-6}$ | — | less than 500 | — | — | more than 1200 | — |

TABLE 2

| property No. | Substrate Material | Thermal expansion coefficient (°C.$^{-1}$) | Buffer layer Material | Young's modulus (kg/mm$^2$) | Thickness (μm) | Matching optimum range | Average life (cycle) | Evaluation |
|---|---|---|---|---|---|---|---|---|
| 21 | 42 Alloy | 4.5 × 10$^{-6}$ | Epoxy resin | 400 | 100 | Δ | 2000 | o |
| 22 | 42 Alloy | 4.5 × 10$^{-6}$ | Filler-containing epoxy resin | 1000 | 100 | Δ | 900 | x |

TABLE 3-1

| property No. | Substrate Material | Thermal expansion coefficient (°C.$^{-1}$) | Buffer layer Material | Young's modulus (kg/mm$^2$) | Thickness (μm) | Matching optimum range | Average life (cycle) | Evaluation |
|---|---|---|---|---|---|---|---|---|
| C1 | Copper laminated invar | 7.2 × 10$^{-6}$ | Epoxy resin | 450 | 100 | x | 500 | x |
| C2 | Copper laminated invar | 7.9 × 10$^{-6}$ | Epoxy resin containing glass cloth | 1600 | 100 | x | 400 | x |

TABLE 3-1-continued

| property No. | Substrate Material | Thermal expansion coefficient (°C.$^{-1}$) | Buffer layer Material | Young's modulus (kg/mm$^2$) | Thickness (μm) | Matching optimum range | Average life (cycle) | Evaluation |
|---|---|---|---|---|---|---|---|---|
| C3 | Copper laminated invar | 4.9 × 10$^{-6}$ | Epoxy resin | 450 | 100 | x | 1000 | x |
| C4 | Copper laminated invar | 5.3 × 10$^{-6}$ | Epoxy resin containing glass cloth | 1600 | 100 | x | 700 | x |
| C5 | Copper laminated invar | 6.0 × 10$^{-6}$ | Polyoleffine | 200 | 100 | x | 800 | x |
| C6 | Copper laminated invar | 6.1 × 10$^{-6}$ | Epoxy resin | 450 | 100 | x | 600 | x |
| C7 | Copper laminated invar | 6.4 × 10$^{-6}$ | Epoxy resin containing glass cloth | 1600 | 100 | x | 500 | x |
| C8 | Copper laminated invar | 6.1 × 10$^{-6}$ | Polyimide resin | 450 | 100 | x | 600 | x |
| C9 | Copper laminated invar | 6.4 × 10$^{-6}$ | Polyimide resin containing glass cloth | 2000 | 100 | x | 500 | x |
| C10 | Fe-base | 12.9 × 10$^{-6}$ | Epoxy resin | 450 | — | x | 100 | x |

TABLE 3-2

| property No. | Substrate Material | Thermal expansion coefficient (°C.$^{-1}$) | Buffer layer Material | Young's modulus (kg/mm$^2$) | Thickness (μm) | Matching optimum range | Average life (cycle) | Evaluation |
|---|---|---|---|---|---|---|---|---|
| C11 | Fe-base | 13.3 × 10$^{-6}$ | Epoxy resin containing glass cloth | 1600 | 100 | x | 100 | x |
| C12 | Al-base | 27.1 × 10$^{-6}$ | Epoxy resin | 450 | 100 | x | 50 | x |
| C13 | Al-base | 28.2 × 10$^{-6}$ | Epoxy resin containing glass cloth | 1600 | 100 | x | 40 | x |
| C14 | glass epoxy | 15.3 × 10$^{-6}$ | none | — | — | x | 80 | x |
| C15 | Copper laminated invar | 3.6 × 10$^{-6}$ | Epoxy resin containing glass cloth | 1600 | 100 | x | 700 | x |
| C16 | Copper laminated invar | 2.4 × 10$^{-6}$ | Epoxy resin containing glass cloth | 2000 | 100 | x | 600 | x |
| C17 | Copper laminated invar | 4.0 × 10$^{-6}$ | Polyether etherketone containing glass cloth | 1800 | 100 | x | 1000 | x |
| C18 | Araimide paper epoxy | 3.4 × 10$^{-6}$ | Epoxy resin containing glass cloth | 1600 | 100 | x | 600 | x |
| C19 | Al$_2$O$_3$ | 7 × 10$^{-6}$ | none | — | — | x | 700 | x |

As seen from these results, in the present invention, an adequate range of the thermal expansion coefficient of the substrate material is 1.0×10$^{-6}$ to 5.0×10$^{-6}$/° C., and the optimum range thereof is 2.0×10$^{-6}$ to 4.0×10$^{-6}$/° C., an adequate range of the Young's modulus of the buffer layer is not more than 1000 kg/mm$^2$, and the optimum range is not more than 1000 kg/mm$^2$, and an adequate range of the thickness of the buffer layer is around 100 μm, for example, 50 to 150 μm.

Thus, in accordance with this test, it is confirmed that a printed board having a life cycle number of more than 1200 can be obtained by using a material satisfying the above conditions.

Additional measurements are described with reference to FIGS. 3, 4 and 9 to 11. The samples are made and measured in the same manner as in the above example but under different conditions. The thermal expansion coefficient on the substrate and the Young's modulus and thickness of the buffer layer are measured.

Figure 9:
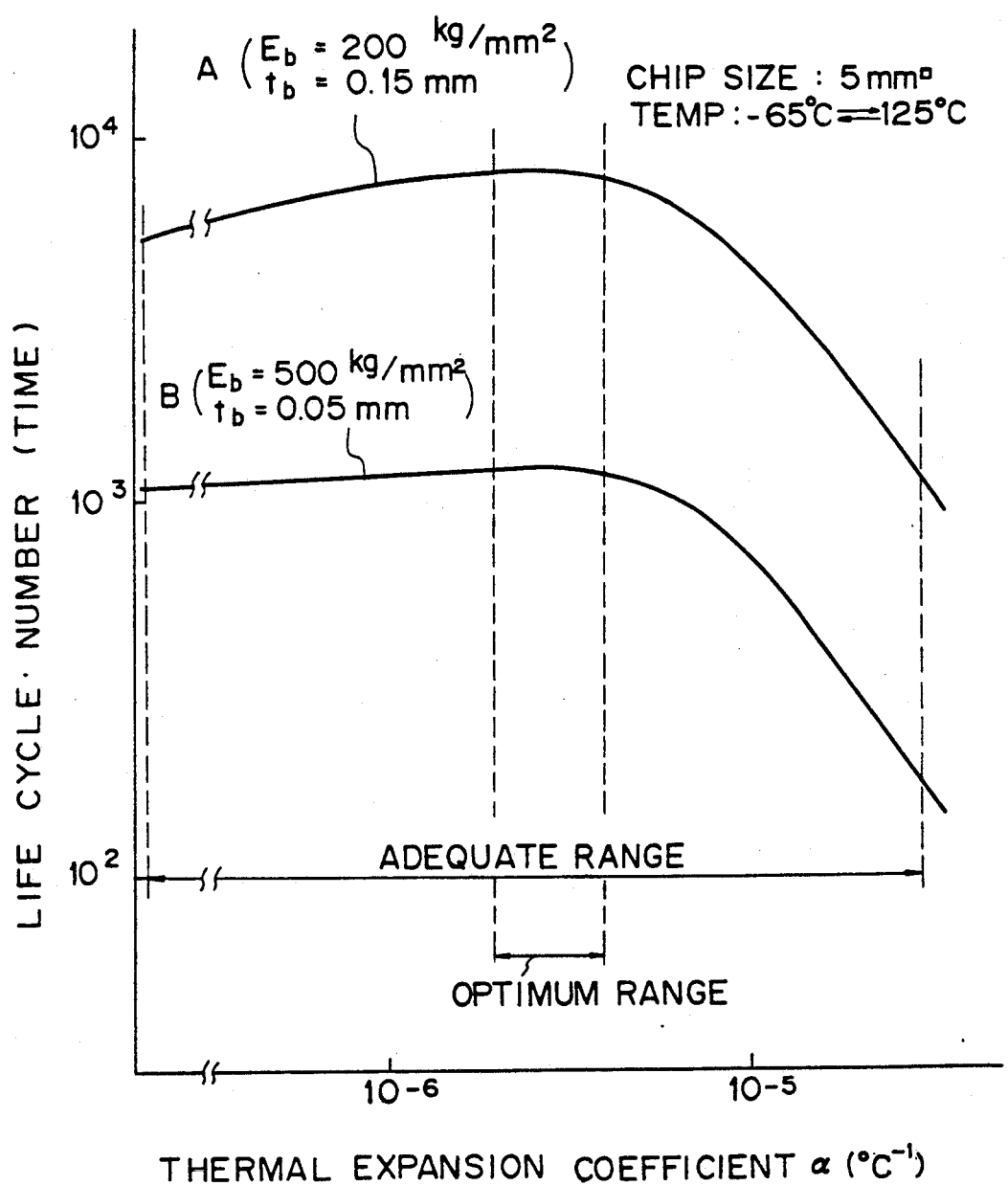
FIG. 9 shows the relationships between the life cycle number and the thermal expansion coefficient.

For determining the optimum range of the thermal expansion coefficient, two types of samples as shown in FIG. 3, under the conditions shown in Table 4, in which chip elements 5 having 5 mm square in size are mounted are prepared. The chip elements are mounted by soldering. The results are shown in FIG. 9 and Table 4.

Figure 10:
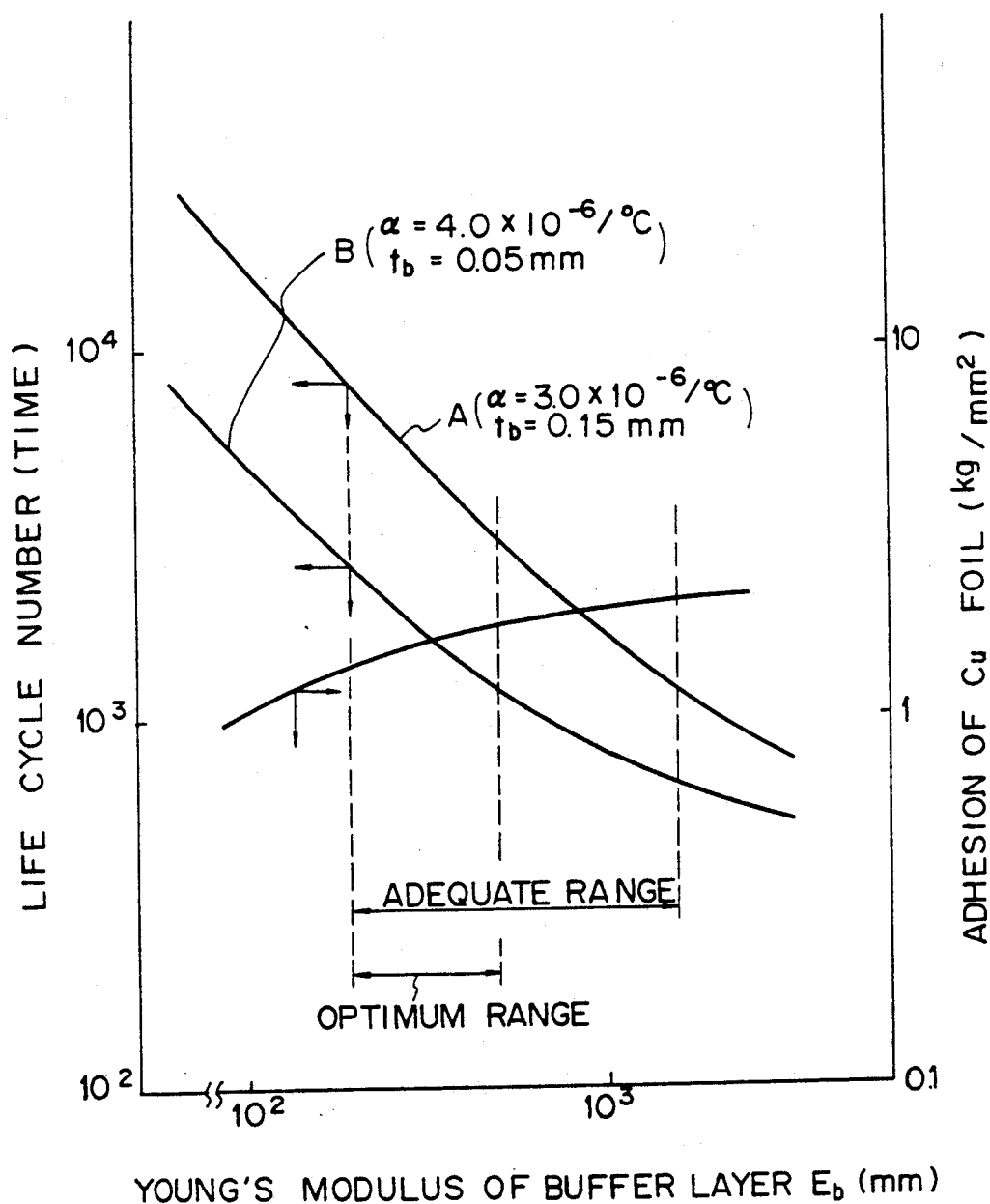
FIG. 10 shows the relationships between the life cycle number and the Young's modulus of the buffer layer.

The optimum ranges of the Young's modulus and the thickness of the buffer layer are measured in the same manner as above. The results are shown in FIGS. 10 and 11 and Table 4.

TABLE 4

| Test item | Range of thermal expansion coefficient of substrate | Young's modulus of material of buffer layer | Thickness range of buffer layer |
|---|---|---|---|
| Conditions | | | |

TABLE 4-continued

| Test item | Range of thermal expansion coefficient of substrate | Young's modulus of material of buffer layer | Thickness range of buffer layer |
|---|---|---|---|
| Condition of sample | | | |
| Sample A | Young's modulus of buffer layer 200 (kg/mm) Thickness 0.15 (mm) | Thermal expansion coefficient of substrate ($3.0 \times 10^{-6}$/°C.) Thickness of buffer layer 0.15 (mm) | Thermal expansion coefficient of substrate ($3.0 \times 10^{-6}$/°C.) Young's modulus of buffer layer 200 (kg/mm$^2$) |
| Sample B | Young's modulus of buffer layer 500 (kg/mm$^2$) Thickness 0.05 (mm) | Thermal expansion coefficient of substrate ($4.0 \times 10^{-6}$/°C.) Thickness of buffer layer 0.05 (mm) | Thermal expansion coefficient of substrate ($4.0 \times 10^{-6}$/°C.) Young's modulus of buffer layer 500 (kg/mm$^2$) |
| Examination conditions | Same as first Example | Same as first Example | Same as first Example |
| | Temperature variation range ($-65°$ C. $\sim 125°$ C.) | | |
| Results | | | |
| Appropriate range | $0. \sim 30.0 \times 10^{-6}$ (°C.) | $200 \sim 1600$ | $0.02 \sim 0.15$ (mm) |
| Optimum range | $2.0 \times 10^{-6} \sim 4.0 \times 10^{-6}$/°C. | $200 \sim 500$ (kg/mm$^2$) | $0.05 \sim 0.15$ (mm) |
| Target life (number) | more than 1200 | more than 1200 | more than 1200 |

As seen in FIG. 9 and Table 4, an adequate range of the thermal expansion coefficient of the substrate is 0 to $30.0 \times 10^{-6}$/° C. and the optimum range is $2.0 \times 10^{-6}$/° C. to $4.0 \times 10^{-6}$/° C. The optimum range means a range providing a life cycle number of 1200 or more even if the Young's modulus and thickness of the buffer layer are outside of the adequate range.

As seen in FIG. 10 and Table 4, an adequate range of the Young's modulus of the buffer layer is 200 to 1600 kg/mm:, and the optimum range is 200 to 500 kg/mm$^2$. It is considered that the lower limit of this range comes from an adhesion of the conductor circuit to the buffer layer.

As seen in FIG. 11 and Table 4, an adequate range of the thickness of the buffer layer is 0.02 to 0.15 mm, and the optimum range is 0.05 to 0.15 mm.

Thus, in a printed board of the present invention, the adequate ranges are 0 to $30.0 \times 10^{-6}$/° C. for the thermal expansion coefficient of the substrate, 200 to 1600 kg/mm$^2$ for the Young's modulus of the buffer layer, and 0.02 to 0.15 mm for the thickness of the buffer layer, and these o satisfy the formula (1).

As seen above, according to the present invention, a semiconductor element-mounting printed board having a life cycle number of 1200 or more can be provided by using materials satisfying the formula (1).

We claim:

1. A semiconductor element-mounting printed board, comprising a substrate having a thermal expansion coefficient not higher than $4.5 \times 10^{-6}$/° C., a buffer layer formed on at least one of the surfaces of the substrate and having a Young's modulus not higher than 450 kg/mm$^2$, a conductor circuit formed on a surface of the buffer layer, the conductor circuit having predetermined patterns, and a semiconductor element bonded to the conductor circuit by soldering.

2. A semiconductor element-mounting printed board according to claim 1, wherein the substrate is formed of copper-laminated invar or aramide-paper-epoxy.

3. A semiconductor element-mounting printed board according to claim 1, wherein the buffer layer is made of one selected from the group consisting of phenolic resin, epoxy resin, polyamide resin, polyester resin, fluorine resin, polysurphone resin, polyethersurphone, polyetherimide, polyetheretherketone and polyamideimide, and has a Young's modulus of not more than 450 kg/mm$^2$.

4. A semiconductor element-mounting printed board according to claim 1, wherein the conductor circuit includes soldering pads and the semiconductor element is a flip chip element bonded to the soldering pads.

5. A semiconductor element-mounting printed board, comprising a substrate having a thermal expansion coefficient of not higher than $4.5 \times 10^{-6}$/° C., a buffer layer formed on at least one of the surfaces of the substrate and having a Young's modulus not higher than 450 kg/mm:, a conductor circuit formed on a surface of the buffer layer, the conductor circuit having predetermined patterns, and a semiconductor element bonded to the conductor circuit by soldering, the buffer layer being made of a material satisfying the following formula:

$$t_b/E_b > \frac{[(190 \cdot \Delta\alpha \cdot 1)^2 + d^2]^{\frac{1}{2}}}{0.016 Es} - (t_s/Es) \qquad (1)$$

where $t_b$ denotes a thickness of the buffer layer,

Eb denotes a Young's modulus of the buffer layer $\Delta\alpha$ denotes a difference between the thermal expansion coefficient of the chip element and of the substrate, d denotes a constant determined by a bending behavior of the substrate ($3.0 \times 10^{-3}$ mm), $t_s$ denotes a height of the solder, Es denotes Young's modulus of the solder, and 1 denotes a size of the chip element or a half of a distance between the outermost bumps, provided that $t_b$ is not more than 0.15 mm and Eb is not less than 200 kg/mm$^2$.

6. A semiconductor element-mounting printed board according to claim 5, wherein the substrate is formed of copper-laminated invar or aramide-paper-epoxy.

7. A semiconductor element-mounting printed board according to claim 5, wherein the buffer layer is made of one selected from the group consisting of phenolic resin, epoxy resin, polyimide resin, polyester resin, fluorine resin, polysurphone resin, polyethersurphone, polyetherimide, polyetheretherketone and polyamideimide, and has a Young's modulus of not more than 450 kg/mm$^2$.

8. A semiconductor element-mounting printed board according to claim 5, wherein the conductor circuit includes soldering pads and the semiconductor element is a flip chip element bonded to the soldering pads.

* * * * *